(12) United States Patent
Zhao et al.

(10) Patent No.: US 12,198,773 B2
(45) Date of Patent: Jan. 14, 2025

(54) MEMORY CHIP TEST METHOD AND APPARATUS, MEDIUM, AND DEVICE

(71) Applicant: CHANGXIN MEMORY TECHNOLOGIES, INC., Hefei (CN)

(72) Inventors: Beiyou Zhao, Hefei (CN); Yu Li, Hefei (CN); Teng Shi, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 179 days.

(21) Appl. No.: 18/155,676

(22) Filed: Jan. 17, 2023

(65) Prior Publication Data

US 2023/0410929 A1 Dec. 21, 2023

Related U.S. Application Data

(63) Continuation of application No. PCT/CN2022/105255, filed on Jul. 12, 2022.

(30) Foreign Application Priority Data

Jun. 21, 2022 (CN) .......................... 202210709222.5

(51) Int. Cl.
  *G11C 29/12* (2006.01)
  *G11C 29/38* (2006.01)
  *G11C 29/40* (2006.01)

(52) U.S. Cl.
  CPC .... *G11C 29/12015* (2013.01); *G11C 29/1201* (2013.01); *G11C 29/38* (2013.01); *G11C 2029/4002* (2013.01)

(58) Field of Classification Search
  CPC .......... G11C 29/12015; G11C 29/1201; G11C 29/38; G11C 2029/4002
  See application file for complete search history.

(56) References Cited

U.S. PATENT DOCUMENTS

| 6,634,002 B1 | 10/2003 | Furubeppu |
| 2006/0064620 A1* | 3/2006 | Kuhn ..................... G11C 29/50 714/742 |

(Continued)

FOREIGN PATENT DOCUMENTS

| CN | 103095289 B | 3/2015 |
| CN | 105654993 A | 6/2016 |

(Continued)

OTHER PUBLICATIONS

"LPDDR5/LPDDR5X JEDEC Specification", Low Power Double Data Rate 5(LPDDR5), JESD209-5B (Revision of JESD209-5A, Jan. 2020).

*Primary Examiner* — Han Yang
(74) *Attorney, Agent, or Firm* — Syncoda LLC; Feng Ma

(57) ABSTRACT

A memory chip test method includes: a mode register write command is sent to a memory chip to control a memory chip to enter a test mode of Write Clock to clock leveling (Wck2ck Leveling); a first preset time is set, and a read and write clock signal is sent to the memory chip after waiting for the first preset time; a predicted value of the Wck2ck Leveling is determined according to the first preset time and a system clock cycle; after sending the read and write clock signal and waiting for a second preset time, a test data output port of the memory chip is detected to obtain a test value; and the test value and the predicted value are compared to determine whether the memory chip is abnormal. A method for testing a Wck2ck Leveling function is provided.

20 Claims, 6 Drawing Sheets

(56) References Cited

U.S. PATENT DOCUMENTS

| | | | |
|---|---|---|---|
| 2008/0082883 A1* | 4/2008 | Gorman | ................ G11C 29/44 |
| | | | 714/733 |
| 2019/0122713 A1 | 4/2019 | Kim | |
| 2022/0076768 A1 | 3/2022 | Pan | |
| 2022/0100409 A1 | 3/2022 | Wang et al. | |
| 2022/0188027 A1 | 6/2022 | Jin et al. | |

FOREIGN PATENT DOCUMENTS

| | | | |
|---|---|---|---|
| CN | 109697996 A | 4/2019 | |
| CN | 113223566 A | 8/2021 | |
| CN | 114155903 A | 3/2022 | |
| CN | 114333965 A | 4/2022 | |
| CN | 114627947 A | 6/2022 | |
| JP | 2001291400 A | 10/2001 | |

* cited by examiner

MEMORY CHIP TEST METHOD AND APPARATUS, MEDIUM, AND DEVICE

CROSS-REFERENCE TO RELATED APPLICATIONS

This is a continuation of International Patent Application No. PCT/CN2022/105255 filed on Jul. 12, 2022, which claims priority to Chinese Patent Application No. 202210709222.5 filed on Jun. 21, 2022. The disclosures of the above-referenced applications are hereby incorporated by reference in their entirety.

BACKGROUND

A Dynamic Random Access Memory (DRAM) is a commonly used semiconductor memory device in computers. Since the DRAM has the advantages of simple structure, high density, low power consumption, low price, etc., it is widely applied to the field of computers and the electronics industry.

Low Power Double Data Rate 5 (LPDDR5) is a design specification in the DRAM, and usually needs to perform functional verification such as Write Clock (WCK) to clock leveling (Wck2ck Leveling) on a designed chip using an automatic detection method.

Since in LPDDR5, the function of Wck2ck Leveling is mainly used to detect a phase relation between a system clock CK and a read and write clock WCK, it is difficult for the computer to directly measure the phase between the two clocks to obtain a verification result of the Wck2ck Leveling.

SUMMARY

The present disclosure relates to the technical field of integrated circuits, and in particular to a method for test of a memory chip, an apparatus for test of a memory chip, a computer readable storage medium, and an electronic device.

According to a first aspect of the present disclosure, a method for test of a memory chip is provided, which may include that: a Mode Register Write (MRW) command is sent to a memory chip to control the memory chip to enter a Wck2ck Leveling test mode; a first preset time is set, and a read and write clock signal is sent to the memory chip after waiting for the first preset time; a predicted value of Wck2ck Leveling is determined according to the first preset time and a system clock cycle; after sending the read and write clock signal and waiting for a second preset time, a test data output port of the memory chip is detected to obtain a test value; and the test value and the predicted value are compared to determine whether the memory chip is abnormal.

According to a second aspect of the present disclosure, an apparatus for test of a memory chip is provided, which may include: a signal sending module, configured to send a MRW command to a memory chip to control the memory chip to enter a test mode of Wck2ck Leveling, and set a first preset time, and send, after waiting for the first preset time, a read and write clock signal to the memory chip; a predicted value determination module, configured to determine a predicted value of the Wck2ck Leveling according to the first preset time and a system clock cycle; a test value determination module, configured to detect, after sending the read and write clock signal and waiting for a second preset time, a test data output port of the memory chip to obtain a test value; and a determination module, configured to compare the test value and the predicted value to determine whether the memory chip is abnormal.

According to a third aspect of the present disclosure, a computer readable storage medium is provided, having stored thereon a computer program that, when executed by a processor, implements the above method for test of a memory chip.

According to a fourth aspect of the present disclosure, an electronic device is provided, which may include: a processor and a memory configured to store an executable instruction of the processor. The processor is configured to execute the above described method for test of a memory chip by executing the executable instruction.

DETAILED DESCRIPTION

Figure 1:
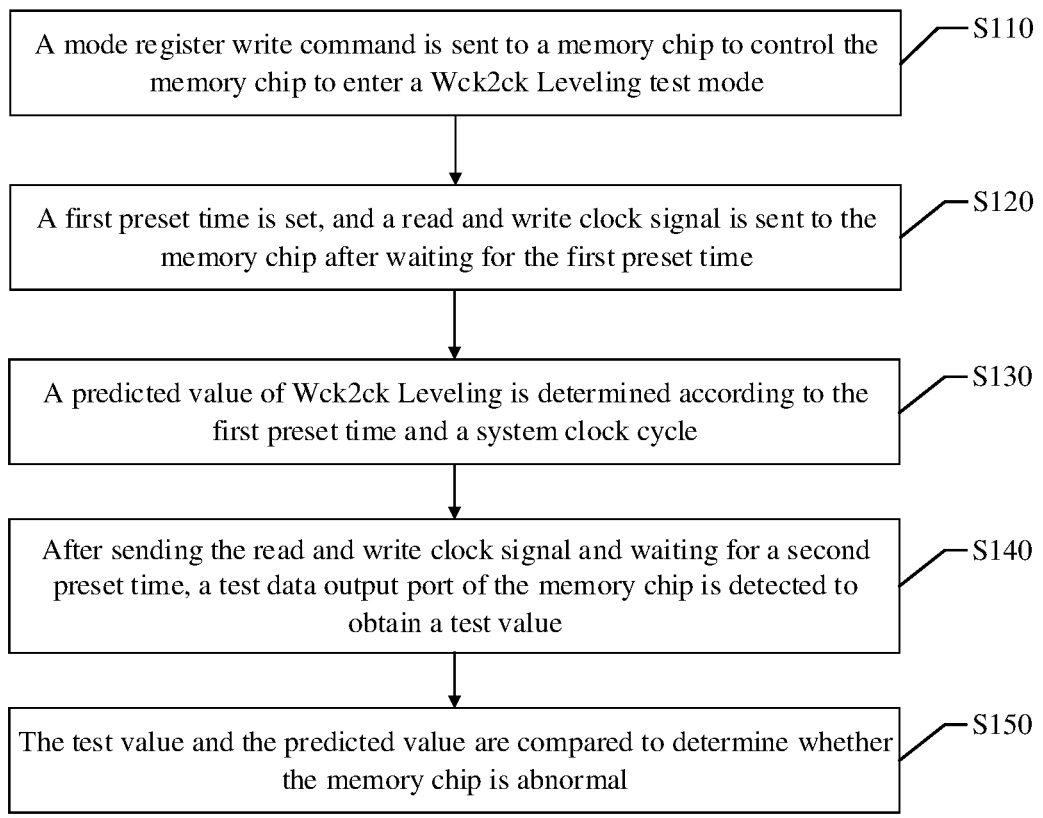
FIG. 1 schematically shows a flowchart of a method for test of a memory chip according to an exemplary embodiment of the present disclosure.

Exemplary implementation modes will now be described more comprehensively with reference to the accompanying drawings. However, the exemplary implementation modes may be implemented in various forms, and should not be understood to be limited to embodiments elaborated herein. Instead, these implementation modes are provided to make the present disclosure more comprehensive and complete, and to comprehensively deliver the ideas of the exemplary implementation modes to those skilled in the art. The described features, structures, or characteristics may be combined in one or more implementation modes in any suitable way. In the following description, numerous specific details are provided to give a thorough understanding of the implementation modes of the present disclosure. However, those skilled in the art may realize that the technical solutions of the present disclosure may be practiced without one or more specific details, or other methods, components, apparatuses, steps, etc. may be adopted. In other cases, well-known technical solutions are not shown or described in detail, so as to avoid obsession and obscure aspects of the present disclosure.

In addition, the drawings are merely schematic illustrations of the present disclosure and are not necessarily drawn to scale. The same reference numerals in the drawings represent same or similar parts, and thus repeated descriptions thereof are omitted. Some block diagrams shown in the drawings are functional entities and do not necessarily have to correspond to physically or logically independent entities. These functional entities may be implemented in the form of software, or implemented in one or more hardware modules or integrated circuits, or implemented in different networks and/or processor apparatuses and/or microcontroller apparatuses.

The flowchart shown in the drawings is only an exemplary description, and it is not necessary to include all steps. For example, some steps may also be decomposed, and some steps may be merged or partially merged, and thus the actual execution order may change according to the actual situation. In addition, terms "first", "second", and "third" below are for the purpose of distinction only and should not be taken as a limitation of the present disclosure.

A semiconductor memory is used in computers, servers, handheld devices such as mobile phones, printers and many other electronic devices and applications. The semiconductor memory may include a plurality of storage units in a memory array, and each storage unit stores at least one bit of information. A DRAM is an example of the semiconductor memory. The solution of the present disclosure is preferably used in the DRAM. Therefore, the following descriptions of embodiments are made with reference to the DRAM as a non-restrictive example.

In a DRAM integrated circuit device, especially in a LPDDR5 DRAM, whether in the design stage, in the test stage, or in the use stage, a functional verification needs to be performed on a memory chip using an automatic detection method. For example, a write function, a read function, a refresh function, a Command Bus Training function, Wck2ck Leveling and other functions are verified.

Besides the above functional verification in the design process of LPDDR5, in the testing process of LPDDR5, a functional test needs to be performed on the Wck2ck Leveling of the memory chip to screen out a chip that works normally. In addition, during the use of LPDDR5, whether the Wck2ck Leveling of the memory chip can work normally needs to be detected automatically to prevent system read and write from making errors.

Based on this, the exemplary implementation modes of the present disclosure provide a method for test of a memory chip for testing a Wck2ck Leveling function of a memory chip. Referring to FIG. 1, the method for test of a memory chip includes the following operations.

At S110, a mode register write (MRW) command is sent to a memory chip to control the memory chip to enter a Wck2ck Leveling test mode.

At S120, a first preset time is set, and after waiting for the first preset time, a read and write clock signal is sent to the memory chip.

At S130, a predicted value of Wck2ck Leveling is determined according to the first preset time and a system clock cycle.

At S140, after sending the read and write clock signal and waiting for a second preset time, a test data output port of the memory chip is detected to obtain a test value.

At S150, the test value and the predicted value are compared to determine whether the memory chip is abnormal.

In the method for test of a memory chip provided by the exemplary implementation modes of the present disclosure, the MRW command is sent to the memory chip, so that the memory chip may be controlled to enter the test mode of Wck2ck Leveling; after entering the Wck2ck Leveling test mode and waiting for the first preset time, a read and write clock may be sent to the memory chip; then, the predicted value of the Wck2ck Leveling may be determined according to the set first preset time and the system clock cycle; and whether the memory chip is abnormal may be determined using the predicted value and the test value at the test data output port of the memory chip. In this way, the test of the Wck2ck Leveling function of the memory chip is realized.

The method for test of a memory chip provided by the exemplary implementation modes of the present disclosure will be described in detail below in combination with the embodiments.

In S110, the MRW command is sent to the memory chip to control the memory chip to enter the Wck2ck Leveling test mode.

In the exemplary implementation mode of the present disclosure, the MRW Command is used to write data to a mode register of a DRAM. The MRW command is implemented cooperatively by a Clock Enable (CKE) signal, a Chip Select (CS) signal, and a Command/Address (CA) signal, such as CA[5:0] (a set of CA signals may be marked as CA[5:0]). The address and data of the mode register are transmitted through CA[5:0]. The cycle time of the MRW command is controlled by a tMRW parameter.

In practical application, the operation that the MRW command is sent to the memory chip is performed by a memory chip controller, for example, a LPDDR5 DRAM Controller sends the MRW command to the LPDDR5 DRAM.

In an exemplary implementation mode of the present disclosure, the MRW command is sent to the memory chip by the memory chip controller, so that the memory chip may be controlled to enter the Wck2ck Leveling test mode, that is, the Wck2ck Leveling mode. Herein, the Wck2ck Leveling mode is a mode for testing the Wck2ck Leveling function of the memory chip, that is, the write clock (WCK) to clock leveling function.

Specifically, the Wck2ck Leveling function is mainly used to detect a phase relation between a system clock CK and a read and write clock WCK. Whether timing of the memory chip operates normally may be determined by detecting the phase relation between the system clock CK and the read and write clock WCK.

In the exemplary implementation mode of the present disclosure, after the memory chip enters the Wck2ck Leveling test mode, the Wck2ck Leveling function of the memory chip may be tested to determine whether the memory chip is abnormal.

In S120, the first preset time is set, and after waiting for the first preset time, the read and write clock signal is sent to the memory chip.

In the exemplary implementation mode of the present disclosure, the first preset time needs to be set in advance to ensure that a predicted value of the Wck2ck Leveling determined according to the first preset time and the system clock cycle is a fixed value, thereby facilitating comparison of the fixed predicted value and the test value.

Figure 2:
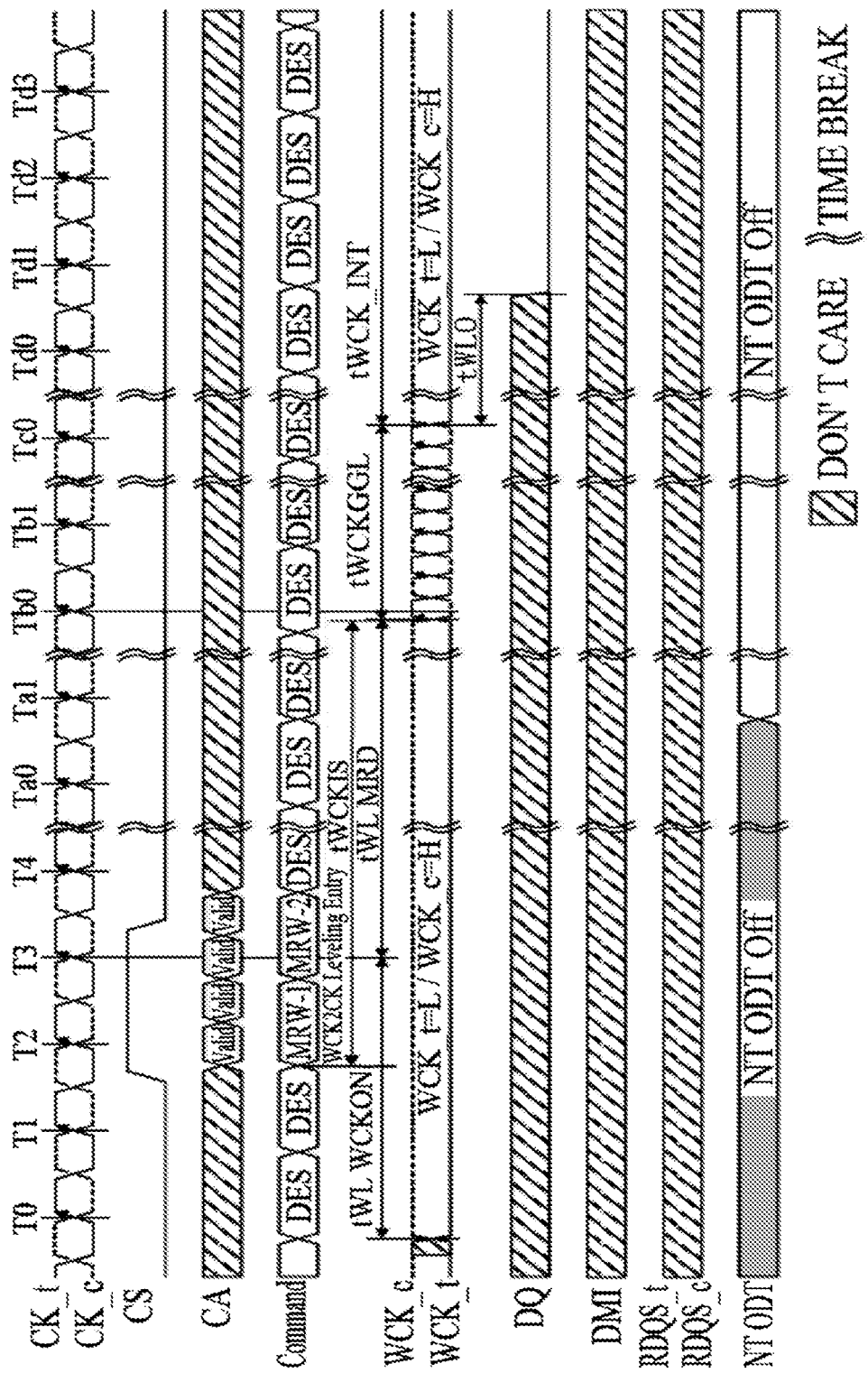
FIG. 2 schematically shows a first timing diagram of a Wck2ck Leveling function according to an exemplary embodiment of the present disclosure.

From a timing diagram of Wck2ck Leveling function shown in FIG. 2, after the memory chip controller sends an MRW command MRW-1 to the memory chip, then to a moment T3 of the system clock CK, and after waiting for the time tWLMRD, the memory chip controller starts to send the read and write clock signal WCK to the memory chip. Therefore, the first preset time is the sum of the time tWLMRD and the time period from the moment from which the MRW command MRW-1 is sent to the memory chip to the moment T3 of the system clock CK.

In the exemplary implementation mode of the present disclosure, the length tWCKIS of the first preset time may be set to satisfy tWCKIS=N*tCK+tis, where tCK is the system clock cycle, N is a positive integer, tis is remaining time, and a deadline point of the remaining time is within an interval of a non-rising edge and a non-falling edge of tCK. Since the deadline point of the remaining time is neither at a rising edge of the system clock cycle tCK nor at a falling edge of the system clock cycle tCK, the system clock cycle tCK corresponding to the deadline point of the remaining time constantly is 0 or 1, and there is no transition of 0-to-1 or 1-to-0.

In practical application, the frequency of the read and write clock signal WCK sent is twice the frequency of the system clock CK, and a read and write clock signal with the length of 7.5 cycles is included in the length of the read and write clock signal WCK sent at one time. Herein, the read and write clock signal WCK is a clock signal that is used during both read and write.

In S130, the predicted value of the Wck2ck Leveling is determined according to the first preset time and the system clock cycle.

In the exemplary implementation mode of the present disclosure, the memory chip enters the Wck2ck Leveling test mode after receiving the MRW command, and after waiting for the first preset time and then sending the read and write clock signal, the time interval tWCKIS from receiving the MRW command to receiving the first rising edge of the read and write clock signal is the first preset time. The predicted value of the Wck2ck Leveling may be calculated according to the first preset time.

In practical application, after receiving the MRW command, the memory chip usually receives the read and write clock signal from the memory chip controller multiple times. For example, referring to a timing diagram of sending a plurality of read and write clock signals shown in FIG. 3, after receiving the MRW command, the memory chip also successively receives three read and write clock signals, that is, the first read and write clock signal, the second read and write clock signal, and the third read and write clock signal.

The first preset time of the memory chip from receiving the MRW command to receiving the first rising edge of the first read and write clock signal may be marked as tWCKIS1. The first preset time of the memory chip from receiving the MRW command to receiving the first rising edge of the second read and write clock signal may be marked as tWCKIS2. The first preset time of the memory chip from receiving the MRW command to receiving the first rising edge of the third read and write clock signal may be marked as tWCKIS3. The starting points of the three first preset times are the same, but their end points are different. The third first preset time tWCKIS3 is greater than the second first preset time tWCKIS2, and the second first preset time tWCKIS2 is greater than the first one first preset time tWCKIS1.

In the exemplary implementation mode of the present disclosure, the preset first preset time tWCKIS is the sum of the remaining time tis and N times the system clock cycle tCK, that is, after subtracting the system clock cycle tCK from the first preset time tWCKIS, there is still the remaining time tis. In an embodiment of the present disclosure, a corresponding value of tCK at the deadline point of the remaining time is taken as the predicted value of the Wck2ck Leveling, that is, the value of the system clock cycle tCK corresponding to the deadline point of the remaining time tis is determined to be the predicted value. The predicted value constantly is 0 or 1.

The determination of the specific value of the predicted value will be described in detail below.

In the exemplary implementation mode of the present disclosure, in the process of determining the predicted value, the remaining time tis may be determined first according to the first preset time tWCKIS and the system clock cycle tCK, and then a specific value of the predicted value of the Wck2ck Leveling is determined according to a range of the remaining time tis. Herein, the range of the remaining time tis may be determined by the system clock cycle tCK. The position of the rising edge of the read and write clock signal WCK may represent the value of the Wck2ck Leveling tWCK2CK. By mapping tWCK2CK to the remaining time tis, the specific position of the rising edge of the read and write clock signal WCK may be determined using the remaining time tis.

In the exemplary implementation mode of the present disclosure, in the process of determining the remaining time tis according to the first preset time tWCKIS and the system clock cycle tCK, a quotient of the first preset time tWCKIS and the system clock cycle tCK may be rounded down to obtain ⌊tWCKISACK⌋, and ⌊tWCKISACK⌋ is determined to be N as mentioned above. That is, N is a value obtained by rounding down the quotient of the first preset time and the system clock cycle.

Then, the remaining time tis=tWCKIS−⌊tWCKIS/TCK⌋*tCK.

Figure 4:
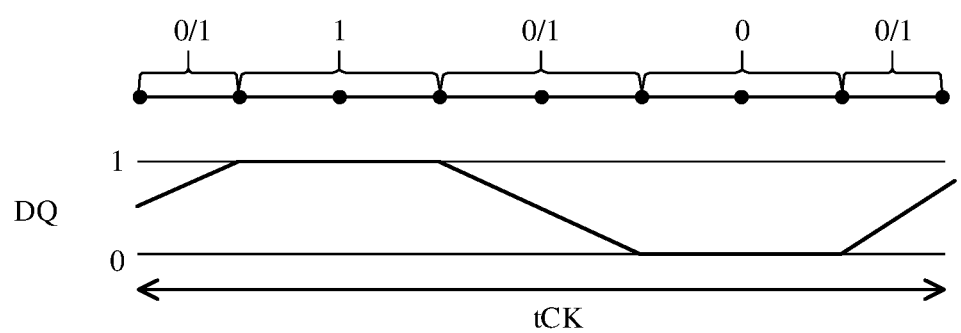
FIG. 4 schematically shows a correspondence diagram of a reference value and a predicted value according to an exemplary embodiment of the present disclosure.

After the remaining time tis is determined, the predicted value may be determined according to the range of the remaining time tis. In the exemplary implementation mode of the present disclosure, referring to FIG. 4, the predicted value DQ is determined according to the range of the remaining time as follows.

When tis>tCK*⅝ and tis<tCK*⅞, the predicted value DQ is determined to be 0.

When tis>tCK/8 and tis<tCK*⅜, the predicted value DQ is determined to be 1.

When 0<tis<tCK/8, or ⅜*tCK<tis<tCK*⅝, or ⅞*tCK<tis<tCK, the predicted value DQ is determined to be 0 or 1.

Herein, the predicted value of 0 indicates that values of the rising edge of the read and write clock signal WCK in its interval are all 0, the predicted value of 1 indicates that the values of the rising edge of the read and write clock signal WCK in its interval are all 1, and the predicted value of 0 or 1 indicates that the predicted value DQ of the rising edge of the read and write clock signal WCK at a certain point in its interval may flip from 0 to 1 or from 1 to 0. According to the standard, if the flip point falls between −⅛tCK and ⅛tck, the design of the memory chip is satisfactory.

It is to be noted that, the operation of setting the first preset time to enable the predicted value of the Wck2ck Leveling to be a fixed value indicates that the first preset time is set to enable the predicted value DQ constantly is 0 or 1. That is, the range of the remaining time tis satisfies tis>tCK*⅝ and tis<tCK*⅞, or tis>tCK/8 and tis<tCK*⅜. Therefore, the set size of the first preset time may be determined according to the range of the remaining time tis.

Figure 3:
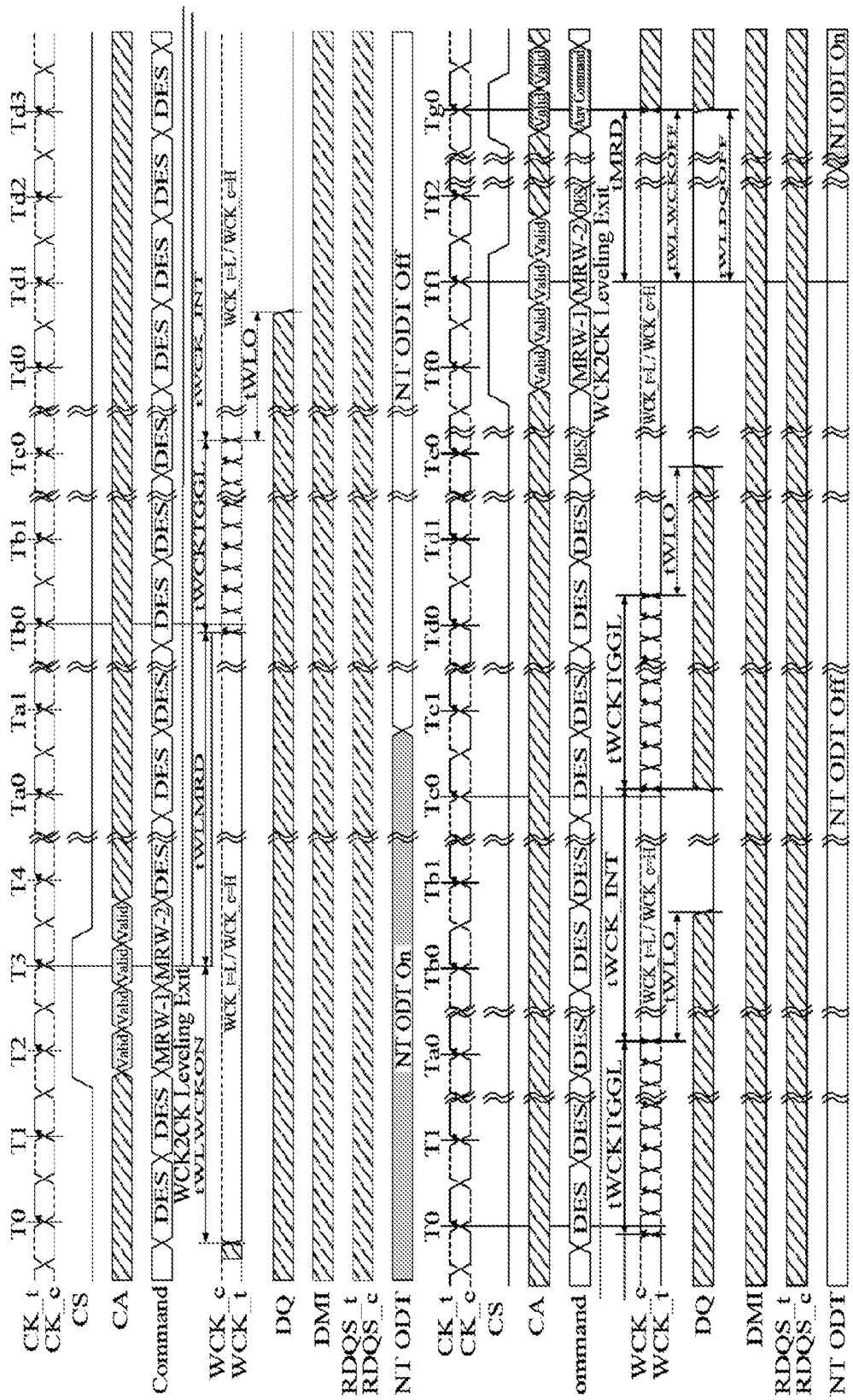
FIG. 3 schematically shows a second timing diagram of a Wck2ck Leveling function according to an exemplary embodiment of the present disclosure.

In a case where a plurality of read and write clocks are sent as shown in FIG. 3, the predicted value of the Wck2ck Leveling corresponding to each read and write clock may be calculated. Specifically, the remaining time tis may be determined first, and the first preset time tWCKIS in the formula of the remaining time tis may be replaced with the first one first preset time tWCKIS1 corresponding to the first read and write clock, the second first preset time tWCKIS2 corresponding to the second read and write clock, and the third first preset time tWCKIS3 corresponding to the third read and write clock respectively. Different remaining times tis1, tis2, tis3, etc. may be obtained for different read and write clock signals, and then the predicted value of the Wck2ck Leveling is determined according to the range of different remaining times. Each of the read and write clock signals corresponds to one predicted value of the Wck2ck Leveling. The obtained predicted values of the Wck2ck Leveling corresponding to the plurality of read and write clock signals may all be used to predict whether the memory chip is abnormal.

In S140, after sending the read and write clock signal and waiting for the second preset time, a test data output port of the memory chip is detected to obtain the test value.

As shown in FIG. 2, after the read and write clock signal WCK is sent, that is, after sending the number of 7.5 flip toggles of 01 and waiting for a second preset time tWLO, the test value may be obtained by detecting the data port of the memory chip.

In the exemplary implementation mode of the present disclosure, an experimental result is usually obtained before the second preset time tWLO and maintained. However, in practical application, the time point of obtaining the experimental result of the memory chip is uncertain, sooner or later. Thus, a latest time is specified for tWLO, that is, the result must be obtained before tWLO at the latest, and the value of the previous result is kept after tWLO.

In practical application, the second preset time tWLO is not a fixed value, and a maximum value is usually specified to be 20 ns. Therefore, in the exemplary implementation mode of the present disclosure, the second preset time tWLO is less than or equal to 20 ns. For example, after sending the read and write clock, and then waiting for 20 ns, the test value may be obtained by detecting the data port of the memory chip.

In S150, the test value and the predicted value are compared to determine whether the memory chip is abnormal.

In the exemplary implementation mode of the present disclosure, after the test value is obtained through the test data output port of the memory chip, whether the memory chip is abnormal may be determined in combination with the predicted value of the Wck2ck Leveling determined previously.

Specifically, if the test value obtained from the test data output port of the memory chip is inconsistent with the predicted value, it may be determined that the memory chip is abnormal. If in the verification process, the test value is determined to be inconsistent with the predicted value using the method for test of a memory chip provided by the exemplary implementation mode of the present disclosure, it is necessary to find the reason and change the circuit design of the memory chip. If in the test process, the test value is determined to be inconsistent with the predicted value using the method for test of a memory chip provided by the exemplary implementation mode of the present disclosure, it is necessary to screen out the memory chip that works normally to ensure product quality. If in the use process of system, the method for test of a memory chip provided by the exemplary implementation mode of the present disclosure may be used to pre-check whether the memory chip works normally, thereby predicting risks in advance, and preventing data loss due to read and write errors.

For a case of a plurality of read and write clocks as shown in FIG. 3, after sending each read and write clock and then waiting for the second preset time tWLO, test values are obtained by detecting the test data output port of the memory chip. Each test value corresponds to one predicted value. As long as there is a pair of test value and predicted value are inconsistent in a plurality of pairs of predicted values and test values, it may be determined that the memory chip is abnormal, and thus corresponding processing needs to be performed.

To sum up, in the method for test of a memory chip provided by the exemplary implementation mode of the present disclosure, the MRW command is sent to the memory chip to control the memory chip to enter the Wck2ck Leveling test mode; after entering the Wck2ck Leveling test mode and waiting for the set first preset time, a read and write clock signal may be sent to the memory chip; then, the predicted value of the Wck2ck Leveling may be determined according to the first preset time and the system clock cycle; and whether the memory chip is abnormal may be tested using the predicted value and the test value at the test data output port of the memory chip, so as to realize the test of the Wck2ck Leveling function of the memory chip. In addition, by sending the read and write clock signals multiple times, a plurality of pairs of test values and predicted values may be determined, which can improve the accuracy of the Wck2ck Leveling function test.

It is to be noted that although various steps of the method in the present disclosure are described in a specific order in the drawings, this does not require or imply that the steps must be performed in the specific order, or that all of the steps shown must be performed to achieve the desired result. Additionally or alternatively, some of the steps may be omitted, a plurality of steps may be combined into one step for execution, and/or one step may be decomposed into multiple steps for execution, and the like.

Figure 5:
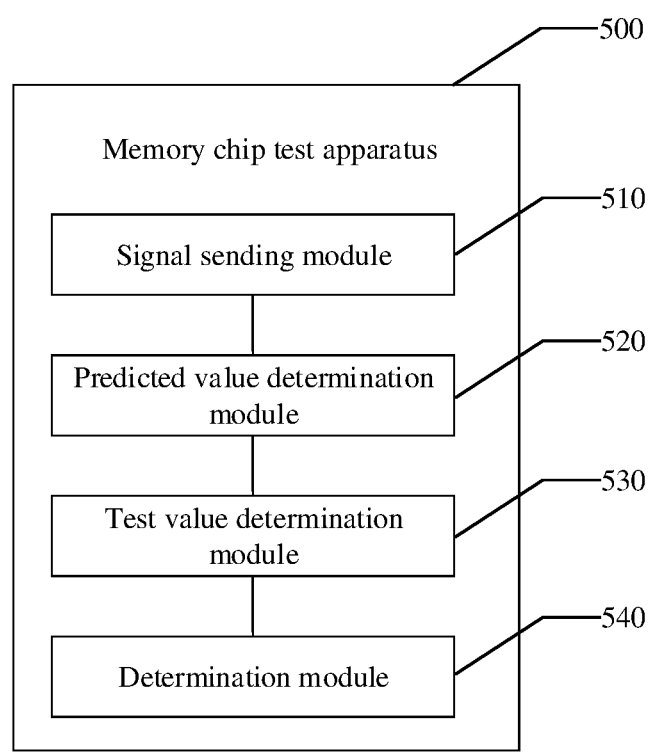
FIG. 5 schematically shows a block diagram of an apparatus for test of a memory chip according to an exemplary embodiment of the present disclosure.

In addition, in an exemplary embodiment, an apparatus for test of a memory chip is further provided. Referring to FIG. 5, the apparatus for test of a memory chip 500 may include: a signal sending module 510, a predicted value determination module 520, a test value determination module 530 and a determination module 540.

The signal sending module 510 is configured to send an MRW command to a memory chip to control the memory chip to enter a Wck2ck Leveling test mode, and set a first preset time, and send a read and write clock signal to the memory chip after waiting for the first preset time.

The predicted value determination module 520 is configured to determine a predicted value of Wck2ck Leveling according to the first preset time and a system clock cycle.

The test value determination module 530 is configured to detect, after sending the read and write clock signal and waiting for a second preset time, a test data output port of the memory chip to obtain a test value.

The determination module 540 is configured to compare the test value and the predicted value to determine whether the memory chip is abnormal.

In an exemplary implementation mode of the present disclosure, the signal sending module 510 may be configured to set a length tWCKIS of the first preset time to satisfy tWCKIS=N*tCK+tis, where tCK is the system clock cycle, N is a positive integer, tis is remaining time, and a deadline point of the remaining time is within an interval of a non-rising edge and a non-falling edge of tCK.

In an exemplary implementation mode of the present disclosure, the predicted value determination module 520 may be configured to take a corresponding value of tCK at the deadline point of the remaining time as the predicted value.

In an exemplary implementation mode of the present disclosure, N is a value obtained by rounding down a quotient of the first preset time and the system clock cycle.

In an exemplary implementation mode of the present disclosure, the predicted value determination module 530 may be configured to determine the predicted value to be 0 when tis>tCK*⅝ and tis<tCK*⅞; and determine the predicted value to be 1 when tis>tCK/8 and ti s<tCK*⅜.

In an exemplary implementation mode of the present disclosure, the determination module 540 may be configured to determine that the memory chip is abnormal if the test value is inconsistent with the predicted value.

In an exemplary implementation mode of the present disclosure, the read and write clock signal is a read and write clock signal with a length of 7.5 cycles.

In an exemplary implementation mode of the present disclosure, the second preset time is less than or equal to 20 ns.

The specific details of virtual modules of each apparatus for test of a memory chip have been described in detail in the corresponding method for test of a memory chip, and thus it will not be elaborated herein.

It is to be noted that, although a plurality of modules or units of the apparatus for test of a memory chip are mentioned in the foregoing detailed descriptions, this kind of division is not mandatory. Actually, according to the implementation modes of the present disclosure, the foregoing described features and functions of two or more modules or units may be embodied in a module or unit. On the contrary, the foregoing described features and functions of a module or unit may further be embodied by a plurality of modules or units.

In the exemplary embodiment of the present disclosure, an electronic device capable of implementing the above method is further provided.

Those skilled in the art may understand that various aspects of the present disclosure may be implemented as systems, methods or program products. Therefore, various aspects of the present disclosure may be specifically implemented in the following forms: a complete hardware implementation mode, a complete software implementation mode (including firmware, microcode, etc.), or a combination of hardware and software, which may be collectively referred to as "circuit", "module" or "system".

An electronic device 600 according to the implementation mode of the present disclosure is described below with reference to FIG. 6. The electronic device 600 shown in FIG. 6 is only an example and should not form any limit to the functions and application scope of the embodiments of the present disclosure.

Figure 6:
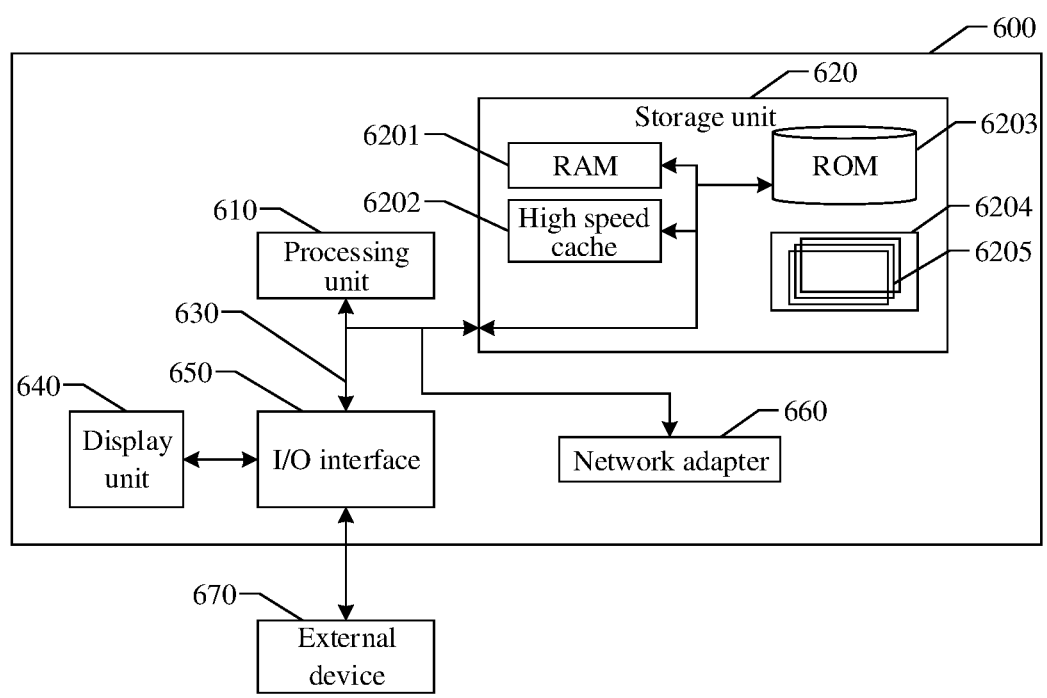
FIG. 6 schematically shows a schematic diagram of modules of an electronic device according to an exemplary embodiment of the present disclosure.

As shown in FIG. 6, the electronic device 600 is represented in the form of a general computing device. The components of the electronic device 600 may include, but are not limited to, at least one processing unit 610, at least one storage unit 620, a bus 630 connecting different system components (which includes a storage unit 620 and a processing unit 610), and a display unit 640.

Herein, the storage unit 620 stores a program code that may be executed by the processing unit 610, to enable the processing unit 610 to execute the steps according to various exemplary implementation modes of the present disclosure described in the above "exemplary methods" section of the description. For example, the processing unit 610 may execute the following steps as shown in FIG. 1. At S110, an MRW command is sent to a memory chip to control the memory chip to enter a Wck2ck Leveling test mode. At S120, a first preset time is set, and after waiting for the first preset time, a read and write clock signal is sent to the memory chip. At S130, a predicted value of Wck2ck Leveling is determined according to the first preset time and a system clock cycle. At S140, after sending the read and write clock signal and waiting for the second preset time, a test data output port of the memory chip is detected to obtain a test value. At S150, the test value and the predicted value are compared to determine whether the memory chip is abnormal.

The storage unit 620 may include a readable medium in the form of a volatile storage unit, such as a Random Access Memory (RAM) 6201 and/or a cache storage unit 6202, and may further include a Read-Only Memory (ROM) 6203.

The storage unit 620 may further include a program/utility 6204 having a set (at least one) of program modules 6205 including, but not limited to, an operating system, one or more application programs, other program modules and program data. Each or a certain combination of these examples may include an implementation of a network environment.

The bus 630 may represent one or more of several types of bus structures, including a storage unit bus or a storage unit controller, a peripheral bus, a graphics acceleration port, a processing unit, or a local area bus using any of a variety of bus structures.

The electronic device 600 may also communicate with one or more external devices 670 (for example, a keyboard, a pointing device, a Bluetooth device, etc.), with one or more devices that enable a user to interact with the electronic device 600, and/or with any device that enables the electronic device 600 to communicate with one or more other computing devices (for example, a router, a modem, etc.). Such communication may be performed through an I/O interface 650. Moreover, the electronic device 600 may also communicate through a network adapter 660 with one or more networks, such as a Local Area Network (LAN), a Wide Area Network (WAN), and/or a public network, such as the Internet. As shown in FIG. 6, the network adapter 660 communicates with other modules of the electronic device 600 through the bus 630. It is to be understood that, although not shown in the figure, other hardware and/or software modules may be used in combination with the electronic device 600, including, but not limited to, a microcode, a device driver, a redundant processing unit, an external disk drive array, a Redundant Arrays of Independent Disk (RAID) system, a tape drive, data backup storage system, etc.

Through the above descriptions of the implementation modes, it is easily understood by those skilled in the art that the exemplary implementation modes described here may be implemented by software, or may be implemented by combining the software and necessary hardware. Therefore, the technical solution according to the implementation modes of the present disclosure may be embodied in form of a software product. The software product may be stored in a non-volatile storage medium (which may be a CD-ROM, a U disk, a mobile hard disk, etc.) or a network, and include a plurality of instructions enabling a computing device (which may be a personal computer, a server, a terminal device, a network device, etc.) to execute the method according to the implementation modes of the present disclosure.

In an exemplary embodiment of the disclosure, a computer readable storage medium is further provided, having stored thereon a program product capable of implementing the above method in the description. In some possible implementation modes, various aspects of the present disclosure may also be implemented in the form of a program product including a program code that, when running on a terminal device, causes the terminal device to perform the method steps according to various exemplary implementation modes of the present disclosure as described in the above "exemplary methods" section of the specification.

A program product for implementing the above method is further provided according to an implementation mode of the disclosure, which may adopt a portable Compact Disk Read Only Memory (CD-ROM) and include a program code, and may run on a terminal device, such as a personal computer. However, the program product of the present disclosure is not limited to this. In the file, the readable storage medium may be any physical medium including or storing a program, and the program may be used by or in combination with an instruction execution system, device, or apparatus.

The program product may adopt any combination of one or more readable mediums. The readable medium may be a readable signal medium or a readable storage medium. The readable storage medium may be, but not limited to, for example, an electrical, magnetic, optical, electromagnetic, infrared, or semiconductor system, device, or apparatus, or any combination thereof. More specific examples (a non-exhaustive list) of the readable storage medium may include an electrical connector with one or more wires, a portable disk, a hard disk, a RAM, a ROM, an Erasable Programmable ROM (EPROM or a flash memory), an optical fiber, a CD-ROM, an optical storage device, a magnetic storage device, or any proper combination thereof.

The computer readable signal medium may include a data signal in a baseband or propagated as part of a carrier, a readable program code being born therein. A plurality of forms may be adopted for the propagated data signal, including, but not limited to, an electromagnetic signal, an optical signal, or any proper combination. The readable signal medium may also be any readable medium except the readable storage medium, and the readable medium may send, propagate, or transmit a program configured to be used by or in combination with an instruction execution system, device, or apparatus.

The program code in the readable medium may be transmitted with any proper medium, including, but not limited to, radio, a wire, an optical cable, Radio Frequency (RF), etc., or any proper combination thereof.

The program code for executing the operations of the disclosure may be written in any combination of one or more programming languages, including object-oriented programming languages such as Java, C++ etc., and conventional procedural programming languages such as "C" language or similar programming languages. The program code may be executed completely on a user computing device, partially on a user device, as a separate software package, partially on a user computing device, partially on a remote computing device, or completely on a remote computing device or server. In the case of a remote computing device, the remote computing device may be connected to a user computing device through any kind of network, including a LAN or a WAN, or may be connected to an external computing device (such as through the Internet using an Internet service provider).

Moreover, the drawings are merely schematic descriptions of processes included in the methods in the exemplary embodiments of the present disclosure, but not for the purpose of limitation. It should be easily understood that the processes shown in the above drawings do not show or limit the chronological order of these processes. Moreover, it is also to be easily understood that these processes may be executed synchronously or asynchronously in a plurality of modules.

After considering the specification and practicing the present disclosure herein, those skilled in the art will easily think about other embodiments of the present disclosure. The application is intended to cover any transformations, uses or adaptive variations of the disclosure, and these transformations, uses or adaptive variations follow the general principle of the present disclosure, and include common general knowledge or conventional technical means undisclosed in the technical field of the present disclosure. The specification and the embodiments are only considered as examples, and the true scope and spirit of the present disclosure are pointed out by the claims.

It should be understood that the present disclosure is not limited to the precise structures described above and shown in the drawings, and various modifications and variations may be made without departing from the scope thereof. The scope of the present disclosure is only defined by the appended claims.

What is claimed is:

1. A method for test of a memory chip, the method comprising:
   sending a mode register write command to a memory chip to control the memory chip to enter a Write Clock to clock leveling (Wck2ck Leveling) test mode;
   setting a first preset time, and sending a read and write clock signal to the memory chip after waiting for the first preset time;
   determining a predicted value of Wck2ck Leveling according to the first preset time and a system clock cycle;
   after sending the read and write clock signal and waiting for a second preset time, detecting a test data output port of the memory chip to obtain a test value; and
   comparing the test value and the predicted value to determine whether the memory chip is abnormal.

2. The method of claim 1, wherein the setting a first preset time comprises:
   setting a length tWCKIS of the first preset time to satisfy tWCKIS=N*tCK+tis, where tCK is the system clock cycle, N is a positive integer, tis is remaining time, and a deadline point of the remaining time is within an interval of a non-rising edge and a non-falling edge of tCK.

3. The method of claim 2, wherein the determining a predicted value of Wck2ck Leveling according to the first preset time and a system clock cycle comprises:
   taking a value of tCK at the deadline point of the remaining time as the predicted value.

4. The method of claim 2, further comprising:
   when tis>tCK*⅝ and tis<tCK*⅞, determining the predicted value to be 0; and
   when tis>tCK/8 and tis<tCK*⅜, determining the predicted value to be 1.

5. The method of claim 1, wherein the comparing the test value and the predicted value to determine whether the memory chip is abnormal comprises:
   if the test value is inconsistent with the predicted value, determining that the memory chip is abnormal.

6. The method of claim 1, wherein the read and write clock signal is a read and write clock signal with a length of 7.5 cycles.

7. The method of claim 1, wherein the second preset time is less than or equal to 20 ns.

8. An apparatus for test of a memory chip, the apparatus comprising:
   a processor; and a memory, configured to store instructions executable by the processor;

wherein the processor is configured to:

send a mode register write command to a memory chip to control the memory chip to enter a Write Clock to clock leveling (Wck2ck Leveling) test mode; and set a first preset time, and send a read and write clock signal to the memory chip after waiting for the first preset time;

determine a predicted value of Wck2ck Leveling according to the first preset time and a system clock cycle;

detect, after sending the read and write clock signal and waiting for a second preset time, a test data output port of the memory chip to obtain a test value; and compare the test value and the predicted value to determine whether the memory chip is abnormal.

9. The apparatus of claim 8, wherein the processor is configured to set a length tWCKIS of the first preset time to satisfy tWCKIS=N*tCK+tis, where tCK is the system clock cycle, N is a positive integer, tis is remaining time, and a deadline point of the remaining time is within an interval of a non-rising edge and a non-falling edge of tCK.

10. The apparatus of claim 9, wherein the processor is configured to take a value of tCK at the deadline point of the remaining time as the predicted value.

11. The apparatus of claim 9, wherein the processor is configured to determine the predicted value to be 0 when tis>tCK*5/8 and tis<tCK*7/8; and determine the predicted value to be 1 when tis>tCK/8 and tis<tCK*3/8.

12. The apparatus of claim 8, wherein the processor is configured to determine that the memory chip is abnormal if the test value is inconsistent with the predicted value.

13. The apparatus of claim 8, wherein the read and write clock signal is a read and write clock signal with a length of 7.5 cycles.

14. The apparatus of claim 8, wherein the second preset time is less than or equal to 20 ns.

15. A non-transitory computer readable storage medium, having stored thereon a computer program that, when executed by a processor, implements the following operations, comprising:

sending a mode register write command to a memory chip to control the memory chip to enter a Write Clock to clock leveling (Wck2ck Leveling) test mode;

setting a first preset time, and sending a read and write clock signal to the memory chip after waiting for the first preset time;

determining a predicted value of Wck2ck Leveling according to the first preset time and a system clock cycle;

after sending the read and write clock signal and waiting for a second preset time, detecting a test data output port of the memory chip to obtain a test value; and comparing the test value and the predicted value to determine whether the memory chip is abnormal.

16. The non-transitory computer readable storage medium of claim 15, wherein the operation of the setting a first preset time comprises:

setting a length tWCKIS of the first preset time to satisfy tWCKIS=N*tCK+tis, where tCK is the system clock cycle, N is a positive integer, tis is remaining time, and a deadline point of the remaining time is within an interval of a non-rising edge and a non-falling edge of tCK.

17. The non-transitory computer readable storage medium of claim 16, wherein the operation of determining a predicted value of Wck2ck Leveling according to the first preset time and a system clock cycle comprises:

taking a value of tCK at the deadline point of the remaining time as the predicted value.

18. The non-transitory computer readable storage medium of claim 16, wherein the computer program, when executed by the processor, further implements the following operation comprising:

when tis>tCK*5/8 and tis<tCK*7/8, determining the predicted value to be 0; and when tis>tCK/8 and tis<tCK*3/8, determining the predicted value to be 1.

19. The non-transitory computer readable storage medium of claim 15, wherein the operation of comparing the test value and the predicted value to determine whether the memory chip is abnormal comprises:

if the test value is inconsistent with the predicted value, determining that the memory chip is abnormal.

20. The non-transitory computer readable storage medium of claim 15, wherein the read and write clock signal is a read and write clock signal with a length of 7.5 cycles, or wherein the second preset time is less than or equal to 20 ns.

* * * * *